United States Patent
Moustakas et al.

(10) Patent No.: US 9,230,818 B2
(45) Date of Patent: Jan. 5, 2016

(54) PLANARIZATION OF GAN BY PHOTORESIST TECHNIQUE USING AN INDUCTIVELY COUPLED PLASMA

(75) Inventors: Theordore D Moustakas, Dover, MA (US); Adrian D Williams, Methuen, MA (US)

(73) Assignee: TRUSTEES OF BOSTON UNIVERSITY, Boston, MA (US)

( * ) Notice: Subject to any disclaimer, the term of this patent is extended or adjusted under 35 U.S.C. 154(b) by 273 days.

(21) Appl. No.: 13/603,130

(22) Filed: Sep. 4, 2012

(65) Prior Publication Data

US 2014/0061861 A1    Mar. 6, 2014

Related U.S. Application Data

(63) Continuation of application No. 12/223,505, filed as application No. PCT/US2007/002943 on Feb. 2, 2007, now Pat. No. 8,257,987.

(60) Provisional application No. 60/764,389, filed on Feb. 2, 2006, provisional application No. 60/880,758, filed on Jan. 17, 2007.

(51) Int. Cl.

| | |
|---|---|
| *H01L 21/3065* | (2006.01) |
| *H01L 31/0304* | (2006.01) |
| *H01L 21/302* | (2006.01) |
| *H01L 21/306* | (2006.01) |
| *H01L 21/02* | (2006.01) |
| *H01L 21/66* | (2006.01) |
| *H01L 33/00* | (2010.01) |
| *H01L 33/32* | (2010.01) |

(52) U.S. Cl.
CPC ...... *H01L 21/3065* (2013.01); *H01L 21/02019* (2013.01); *H01L 21/302* (2013.01); *H01L 21/30621* (2013.01); *H01L 31/03044* (2013.01); *H01L 22/12* (2013.01); *H01L 22/20* (2013.01); *H01L 33/007* (2013.01); *H01L 33/32* (2013.01); *Y02E 10/544* (2013.01)

(58) Field of Classification Search
CPC .................................................. H01L 21/3065
USPC .......................................................... 257/615
See application file for complete search history.

(56) References Cited

U.S. PATENT DOCUMENTS

| | | | |
|---|---|---|---|
| 6,596,079 B1 * | 7/2003 | Vaudo et al. ..................... | 117/97 |
| 2004/0124427 A1 * | 7/2004 | Hsu et al. ......................... | 257/85 |
| 2009/0236693 A1 * | 9/2009 | Moustakas et al. ............ | 257/615 |

* cited by examiner

*Primary Examiner* — Edward Wojciechowicz
(74) *Attorney, Agent, or Firm* — Preti Flaherty Beliveau & Pachios LLP

(57) ABSTRACT

Films of III-nitride for semiconductor device growth are planarized using an etch-back method. The method includes coating a III-nitride surface having surface roughness features in the micron range with a sacrificial planarization material such as an appropriately chosen photoresist. The sacrificial planarization material is then etched together with the III-nitride roughness features using dry etch methods such as inductively coupled plasma reactive ion etching. By closely matching the etch rates of the sacrificial planarization material and the III-nitride material, a planarized III-nitride surface is achieved. The etch-back process together with a high temperature annealing process yields a planarized III-nitride surface with surface roughness features reduced to the nm range. Planarized III-nitride, e.g., GaN, substrates and devices containing them are also provided.

11 Claims, 16 Drawing Sheets

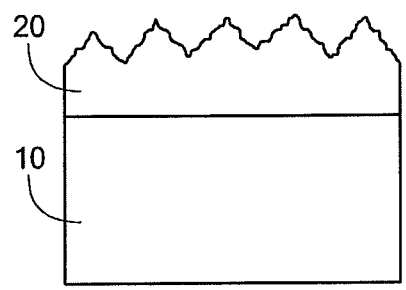
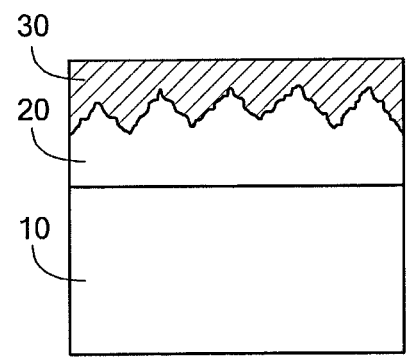
*FIG. 1A*  *FIG. 1B*
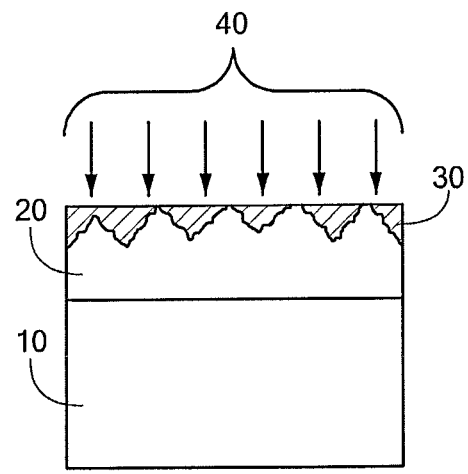
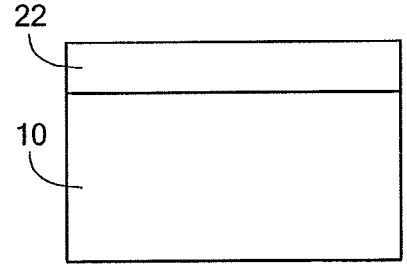
*FIG. 1C*  *FIG. 1D*

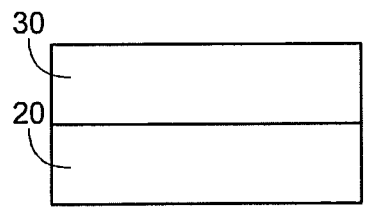
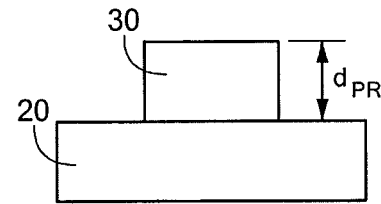
FIG. 10A   FIG. 10B
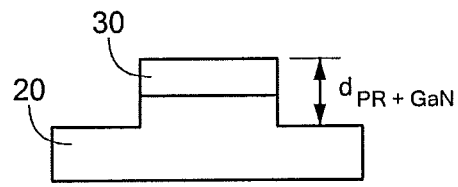
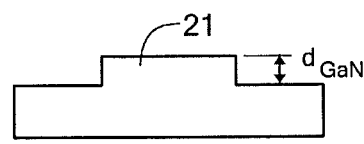
FIG. 10C   FIG. 10D
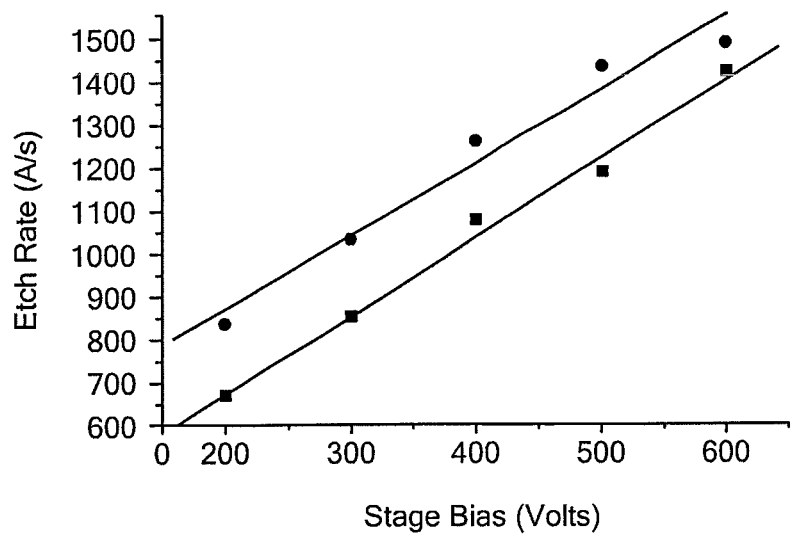
FIG. 11

PLANARIZATION OF GAN BY PHOTORESIST TECHNIQUE USING AN INDUCTIVELY COUPLED PLASMA

CROSS REFERENCE TO RELATED APPLICATIONS

This application claims the priority of U.S. National Phase application Ser. No. 12/223,505 filed Jul. 31, 2008 entitled, PLANARIZATION OF GAN BY PHOTORESIST TECHNIQUE USING AN INDUCTIVELY COUPLED PLASMA. This application also claims the priority of PCT/US2007/002943 filed Feb. 2, 2007 entitled: PLANARIZATION OF GAN BY PHOTORESIST TECHNIQUE USING AN INDUCTIVELY COUPLED PLASMA. This application also claims priority of U.S. Provisional Application No. 60/880,758, filed Jan. 17, 2007 and entitled PLANARIZATION OF GaN BY PHOTORESIST TECHNIQUE USING AN INDUCTIVELY COUPLED PLASMA. This application also claims priority of U.S. Provisional Application No. 60/764,389, filed Feb. 2, 2006 and entitled, PLANARIZATION OF GaN BY PHOTORESIST TECHNIQUE USING AN INDUCTIVELY COUPLED PLASMA. Each of the above listed earlier applications is hereby incorporated by reference herein.

STATEMENT REGARDING FEDERALLY SPONSORED RESEARCH OR DEVELOPMENT

This invention was made with United States Government support provided under Contract No. DAAD 19-00-2-0004 awarded by the U.S. Army Research Office. The United States Government has certain rights in the invention.

BACKGROUND OF THE INVENTION

Many components used in optical and semiconductor devices must be very smooth, since surface roughness acts to both scatter light and enhance absorption. For many multi-level integrated circuits, the planarization of dielectric layers, which acts to isolate devices as well as form the base layer for subsequent stacks of devices, is an important technology. Particularly in the case of the epitaxial growth of electronic materials, high quality substrates for many uses are expected to be atomically smooth.

The development of robust planarization techniques for III-nitride materials such as GaN will undoubtedly play a crucial role in the continued advancement of nitride-based semiconductor devices. With the inevitable emergence of commercially available GaN wafers, manufactures of such have an unquestionable need to develop methods to planarize them prior to sale. Such substrates would bypass problems such as cracking and high dislocation densities stemming from the epitaxial growth of nitrides on non-native substrates.

The growth of thick, atomically smooth GaN films is a significant challenge when employing high growth rates (on the order of hundreds of microns per hour) obtained with techniques such as halide vapor phase epitaxy (HVPE). The ability to planarize rough films would allow their use in the epitaxial growth of devices and thus increase the yield of the HVPE process. Substrate manufacturers lose material due to rough areas resulting from process non-uniformities. Appropriate planarization methods would act to recover such lost area.

The traditional method of planarizing semiconductor materials is lapping followed by chemo-mechanical polishing (CMP). Lapping is a coarse planarization technique utilizing successively smaller sizes of pad-embedded grits of very hard materials such as diamond, cubic boron nitride, or alumina to achieve bulk removal and flattening of a material through grinding action. Lapped surfaces tend to have micron-scale roughness. Chemo-mechanical polishing is a planarization technique that simultaneously uses both chemical and mechanical processes to achieve a finer degree of planarization. This is accomplished by a far gentler grinding of the semiconductor with nanoscale grits embedded in an etching solution. CMP techniques exist for materials such as silicon, germanium, arsenide and phosphide semiconductors.

III-nitrides materials, however, do not lend themselves to wet etching at room temperature due to their extreme hardness and resistance to chemical attack. The Vicker hardness of GaN is 12 GPa, which is close to that of sapphire, which has a hardness of 20 GPa. This places GaN at level 9 on the Moh's hardness scale. Efforts to polish GaN with harder materials such as diamond typically leave the surface full of undesirable scratches. Furthermore, since GaN is highly anisotropic, every crystal face presents its own challenges. Weyher, et al. (Journal of Crystal Growth, 182:17 (1997)) report the polishing of freestanding GaN platelets using KOH solutions (1:2-1:20) and a soft polishing pad with an applied pressure of 2-4 $kg/cm^2$. However, that work is applicable only to polishing of the nitrogen polarity of GaN, which is by far the easiest orientation to etch. Tavernier et al. (Electrochemical and Solid State Letters, 5:G61 (2002)) concluded that polishing action was not achieved on Ga-polar material.

GaN ablation experiments, utilizing a pulsed KrF excimer laser under appropriate conditions, have also been reported as a method to decrease surface roughness. While laser etching of GaN is feasible, the process of globally planarizing large areas of very rough material by this method would be cumbersome and time consuming, owing to the need for precise control of mechanical stages, optical alignment, and feedback systems to allow for adaptation of the local pulse dosage to changes in the surface height.

Etch back methods have been used during the processing of multilevel integrated circuits to planarize interlayer dielectrics. However, such methods have not been applied to III-nitride materials due to the difficulties in etching these materials as described above.

Thus, there remains a need for a robust, generally applicable planarization technique for GaN and other III-nitrides.

SUMMARY OF THE INVENTION

The invention provides methods of planarizing III-nitride substrates or films as well as compositions and devices produced using the methods. The methods use an etch-back procedure, optionally followed by an annealing procedure. An as grown III-nitride surface of a substrate or thin or thick film with surface roughness features is coated with a sacrificial planarization material, such as a photoresist, under conditions chosen to achieve an essentially planar surface. The sacrificial planarization material and the III-nitride material are then etched using conditions that favor approximately equal etching rates for the sacrificial planarization material and the III-nitride material. Dry etch methods are preferred, such as using an inductively coupled plasma and controlling the etch rate by adjusting the plasma chemistry, the plasma RF energy, and the stage bias. A subsequent high temperature annealing process can be added to cure structural defects and render an atomically smooth planarized surface. The methods are capable of planarizing III-nitride (e.g., GaN) surfaces in any crystal plane. The resulting planarized III-nitride surfaces are particularly useful in preparing high quality optical and semiconductor devices.

One aspect of the invention is a method for planarizing a surface of a III-nitride substrate having surface roughness features. The method includes the steps of coating the surface with a layer of sacrificial planarization material to cover the surface roughness features, etching the sacrificial planarization material to expose the surface roughness features, and simultaneously etching the sacrificial planarization material and the surface roughness features to reduce the height of the surface roughness features.

In certain embodiments, the ratio of sacrificial planarization material etch rate to III-nitride etch rate can be in the range of 0.2 to 1.8, or in the range of 0.8 to 1.2. 17. Etching is performed using a dry etch technique such as inductively coupled plasma reactive ion etching. For example, where the III-nitride material is GaN, the plasma can contain $Cl_2$, $BCl_3$, Ar, or any mixture thereof. In general a chemical etching method (e.g., any of the above mentioned plasmas) is combined with a physical method (e.g., sputtering or addition of heavy atoms (e.g., Ar) to a plasma. However, a purely chemical or purely physical etching process could also be used. The RF power coupled into the plasma can be adjusted to obtain a desired etch rate. The stage bias also can be set to obtain a desired etch rate. For example, the stage bias can be in the range of 0 to −1000 volts; in preferred embodiments, the stage bias is in the range of −100 to −700 volts.

In various embodiments, the mean thickness of the layer of sacrificial planarization material prior to etching can be less than 5 times the rms roughness, or less than 2 times the rms roughness of the surface. The step of coating can be performed by spin coating or sputtering. Prior to etching, the mean thickness of the layer of sacrificial planarization material can be at least 100 Å greater than the maximum height of the surface roughness features. Suitable sacrificial planarization materials include photoresists, epoxy resins, and spin-on glass. Photoresists that can be used include AZ5214, AZ4330RS, and AZ4620.

The III-nitride materials planarized according to a method of the invention include GaN, AlN, InN, AlGaN, InGaN, and AlInGaN. The III-nitride material can be grown by epitaxy on any crystallographic plane of sapphire, including the C-plane, the A-plane, the M-plane, and the R-plane. The III-nitride materials can be grown, for example, on sapphire, silicon, silicon carbide, zinc oxide, or glass, or another suitable substrate for the production of semiconductor or optical devices. The III-nitride material can be a film grown by methods including hydride vapor phase epitaxy (HVPE), molecular beam epitaxy (MBE), metal organic chemical vapor deposition (MOCVD), a liquid phase epitaxy solution method, or a sublimation method.

The planarization method can include performing the coating and etching steps two or more times, or three or more times. The method can further include the step of annealing the etched III-nitride surface. Annealing can be performed by exposing the surface to a HCl solution (e.g., 1 M HCl), but preferably annealing is performed by thermal annealing (e.g., for 10 minutes at 750° C.) in the presence of GaCl, HCl, $H_2$, and $N_2$. If annealing is performed, the method can include the step of determining the presence or absence of surface defects by photoluminescence or cathodoluminescence, and, if warranted, performing an additional annealing step.

The final rms roughness of the surface after performing the planarization method can be less than 50 nm, less than 20 nm, less than 10 nm, or less than 3 nm. The surface also can be essentially devoid of linear surface defects deviating from the final surface plane by more than 1 µm, or more than nm, unlike a surface planarized by chemomechanical polishing. Another aspect of the invention is a III-nitride substrate made by a method according to the invention.

In still further aspects of the invention, the III-nitride layer is incorporated into a semiconductor device, such as a light emitting diode, a laser diode, or a solar cell. Within the device, the layer can be a functional device layer, such as a light emitting layer, a multiple quantum well layer, or a buffer layer.

DESCRIPTION OF THE DRAWINGS

Other features and advantages of the present invention will be apparent from the detailed description of the invention that follows, taken in conjunction with the accompanying drawings of which:

FIG. 1 is a schematic illustration of one embodiment of the etch-back technique as applied to a GaN surface; FIG. 1A shows as grown GaN with a rough surface; in FIG. 1B a coating of sacrificial planarization material has been added; in FIG. 1C the sacrificial planarization material is etched back; in FIG. 1D the sacrificial planarization material together with the GaN surface roughness features have been etched away leaving a planarized GaN surface;

in FIG. 2A the sacrificial planarization material has been deposited on a step feature; in FIG. 2B the sacrificial planarization material has been etched back to just reveal the GaN step; in FIG. 2C the sacrificial planarization material has etched faster than the GaN; FIG. 2D shows the result of the process in 2C, leaving a partial GaN step; in FIG. 2E the sacrificial planarization material has etched at the same rate as GaN, resulting (FIG. 2F) in a planarized GaN surface; in FIG. 2G the GaN has etched faster than the sacrificial planarization material, resulting (FIG. 2H) in a GaN pit; In FIG. 2I the sacrificial planarization material has etched at least twice as fast as the GaN, resulting (FIG. 2J) in an inverted step feature;

FIG. 5 shows an illustration of two silicon test structures.

FIG. 7 shows the resulting surface feature height after coating a step feature such as shown in FIG. 6 with various photoresists as a function of spin speed.

FIG. 10 shows different aspects of a measurement of surface roughness; FIG. 10A shows photoresist spin-coated over a GaN surface; In FIG. 10B the photoresist has been exposed to form a pattern exposing GaN; In FIG. 10C the exposed photoresist and exposed GaN are etched simultaneously; In FIG. 10D the photoresist has been removed and the height profile is measured;

FIG. 11 shows the relation between etch rate and stage bias for GaN (squares) and AZ5214 (circles);

FIG. 14 shows atomic force microscopy (AFM) images of a C-plane (0001) GaN surface subjected to two iterations of an etch-back process according to the invention.

FIG. 15 shows AFM images of an a-plane (11-20) GaN surface subjected to three iterations of an etch-back process according to the invention.

FIG. 16 shows SEM images of C-plane and A-plane GaN surfaces before and after planarization by a method according to the invention (scale bars represent 20 µm); FIG. 17 shows images of a C-plane GaN surface planarized by an etch-back and annealing (HYPE regrowth) process according to the invention.

DETAILED DESCRIPTION OF THE INVENTION

Figure 2:
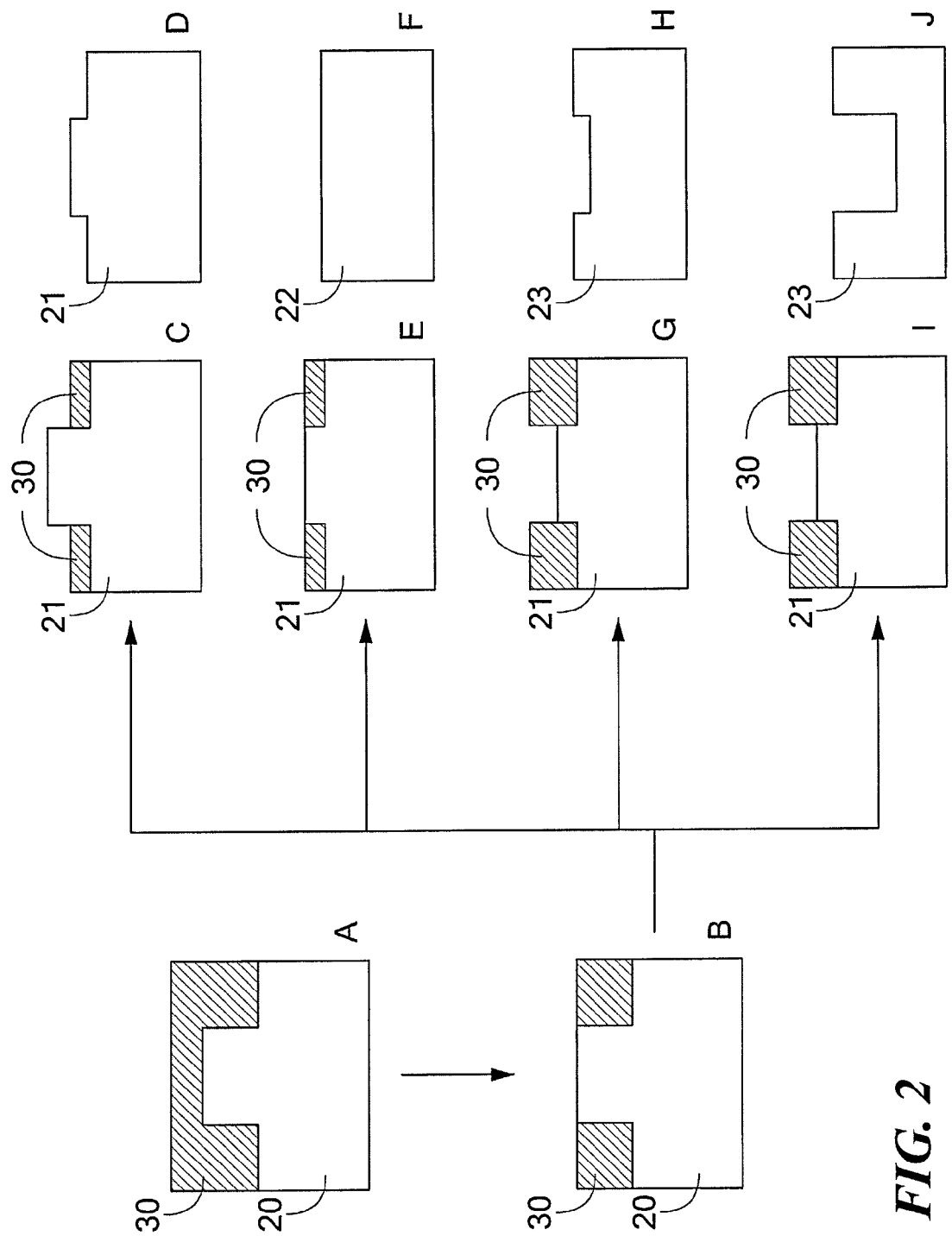
FIG. 2 is a schematic illustration of the possible evolution of GaN surface features resulting from different selectivities of etching of the sacrificial planarization material vs. the GaN material.

The etch-back methods according to the invention can be used to planarize rough III-nitride substrates, for example, GaN, AlN, or InGaN substrates or films grown by HVPE, MBE, or MOCVD that possess surface roughness features. The etch-back method includes two main steps. The first step is the deposition onto the III-nitride surface of a coating of sacrificial planarization material (also referred to herein as "sacrificial material" or "sacrificial layer" or "planarization layer") which fills the valleys and crevices found on the rough surface while simultaneously generating an essentially planar top surface. The second step is an etching process in which the planarization layer and the III-nitride material are etched back simultaneously. If the selectivity (defined as the III-nitride etch rate divided by the planarization layer etch rate) of the etch process is close to one, the planar morphology of the sacrificial surface is transferred to the III-nitride surface once all of the sacrificial planarization material is etched back.

"Planarization" is the conversion of a surface exhibiting surface roughness features to one that more closely resembles an ideal planar surface for which all surface points can be mapped mathematically by the equation of a plane. The amount by which a surface strays from this ideal is referred to herein as the "roughness" or "surface roughness". A surface that has undergone a process of planarization is a "planarized" surface.

A III-nitride material for use in the planarization method according to the invention can be a substrate, a thick film, or a thin film, for example a substrate or a film that is part of a semiconductor device or an optical device. The III-nitride material can be prepared, for example, by a process such as halide vapor phase epitaxy, molecular beam epitaxy, liquid phase epitaxy in solution, sublimation, or metal organic chemical vapor deposition.

FIG. 1 shows an illustration an embodiment of a planarization method according to the invention. The starting material is depicted in FIG. 1A. A III-nitride (e.g., GaN) layer 20 exhibits surface roughness features on an exposed surface and is typically, but need not be, deposited on a substrate layer 10, such as sapphire. The interface between the substrate 10 and the III-nitride 20 may be either rough or planarized, and is not relevant to the planarization process for the exposed III-nitride surface. The III-nitride surface having surface roughness features can be intended as the outer surface of a semiconductor device or as a substrate upon which a subsequent layer will be deposited. Surface roughness features may result from the deposition process used to prepare the III-nitride layer, and are generally characterized by an rms roughness in the µm range or greater. The surface roughness features may also include crystal lattice defects or other defects that have been replicated from the substrate layer 10.

FIG. 1B shows the structure following the first step of the method, the coating of III-nitride layer 20 with planarization layer 30. The surface roughness features of III-nitride layer 10 have been covered, preferably completely covered, with planarization layer 30. The coating process has been performed so as to yield an essentially planar surface of planarization layer 30.

An essentially planar surface can be obtained in a variety of ways. For example, a sacrificial planarization material such as a photoresist can be deposited on the surface and spread by spin coating. A spin-coating process can be performed using sufficiently high spin speed or centrifugal force and for sufficiently long to yield a smooth, essentially planar surface, i.e., a surface that partially or completely fills the voids between surface roughness features. In some embodiments, the sacrificial planarization material can completely cover the majority of, or all of, the peaks of surface roughness features. In certain embodiments, the coated surface retains a portion of the original surface roughness profile. In general, however, any coating will provide a reduced surface roughness profile (i.e., reduced height of surface roughness features) compared to the surface before the coating was applied. Optionally, multiple layers of sacrificial planarization material can be applied, either using the same material or different materials in one or more subsequent layers applied on top of the initial layer. In this way, it may be possible to achieve a greater reduction in surface roughness profile.

Additional methods of achieving an essentially planar surface of the sacrificial planarization material can be employed. For example, a solid material can be melted onto the surface to be planarized. Surface tension effects of a liquid applied to the surface can also be used to achieve an essentially planar surface; prior to etching the planar liquid film is solidified. Solvent evaporation can be used to leave an essentially planar surface of sacrificial planarization material. Yet another method of forming an essentially planar surface is to press or stamp a sufficiently planar object, such as an optical flat, onto a sacrificial planarization material such as a photoresist prior to hardening (see U.S. Pat. No. 6,391,798, which is hereby incorporated by reference). Sputtering methods can also be employed. For example, a layer of sacrificial material is sputtered onto the surface for planarization, and heat is applied to float the sputtered material as an essentially planar layer; rapid cooling then preserves the planar surface. For example, glass can be floated at a temperature of about 500° C. Another technique which can be used is screen printing.

Three criteria which are important in selecting an appropriate sacrificial planarization layer are the ability of the sacrificial material to form an essentially planar surface, the ability of the sacrificial material to form a thin coating (so as to minimize the amount of sacrificial material that must be etched), and the ability to etch the sacrificial material at a rate close to the rate of the III-nitride material. Thus, a method of selecting a sacrificial material for planarizing a III-nitride material by an etch-back process includes the steps of: choosing a first group of candidate sacrificial materials capable of forming a planar surface, choosing from the first group a second group of candidate sacrificial materials capable of forming a thin sacrificial layer, and choosing a sacrificial material from the second group whose etch rate is close to that of the III-nitride material.

FIG. 1C shows the structure during the second step, which is the simultaneous etching of planarization layer 30 by etching conditions 40. The etching conditions represent the sum total of the chemical agents and physical agents used to achieve etching, and can include chemicals such as $Cl_2$ gas, or another gas, in the form of an inductively coupled plasma, as well as the radio frequency (RF) power coupled into the plasma and a bias voltage applied to the stage (chuck) upon which the III-nitride and substrate are mounted. Preferably, planarization layer 30 and the surface features of III-nitride layer 20 are etched at approximately the same rate. In the most preferred embodiments, the selectivity (ratio of III-N etch rate to planarization layer etch rate) is about 1. In preferred embodiments, the selectivity is from about 0.8 to 1.2. In other embodiments the selectivity is from about 0.2 to about 1.8.

FIG. 1D illustrates the structure following the planarization process. The III-nitride layer 22 now has reduced surface roughness features (i.e., is planarized) compared to the starting condition 20.

The application of this method to GaN and other III-nitrides is complicated by the high resistance of these materials to chemical etching. Further complicating factors are the physical properties of III-nitrides that are highly dependent on crystal orientation and doping levels. Another challenge is finding a compatible sacrificial material that can be deposited in a manner that leads to developing a planar surface upon etching. A key aspect is balancing the selectivity of the etch process between the rate of etching of the sacrificial material and the rate of etching of the III-nitride material. The value of the selectivity ultimately determines the efficiency of the process and can influence the number of iterations of the method required to achieve the desired level of roughness. An iteration is one step of coating the III-nitride surface with the sacrificial planarization material plus one step of etching the sacrificial planarization material and the III-nitride material to yield a planarized III-nitride material. Ideally the etch process is tailored to achieve a selectivity equal to one. However, materials with very high bond strength such as diamond, sapphire, and III-nitrides including GaN, are not readily etched with appreciable rates by conventional wet etch chemistries. According to the invention, dry etching techniques are preferred to carry out the etching step. Dry etch methods utilize ion bombardment to break high-energy bonds. Furthermore, the difficulties of etching GaN or another III-nitride are compounded by the need to balance its rate of etching with the rate of etching of an appropriate sacrificial material.

FIG. 2 illustrates three regimes of operation of the etch-back process, with different outcomes that depend on the etch selectivity (Se) between the III-nitride material to be planarized and the sacrificial layer. In each case, a surface feature of III-nitride layer 20 is first coated with sacrificial planarization material 30 sufficient to cover the surface feature (step feature in FIG. 2A). The etch process is initially carried out until the surface feature is exposed (FIG. 2B). Operation in Region I (top pathway), defined by 0<Se<1, leads to a direct reduction in roughness by a factor of (1−Se), as shown in FIGS. 2C and 2D. The resultant morphology is kept intact, only scaled down. Operation in Region II (third from top), defined by 1<Se<2, also leads to a reduction in roughness by a factor (1−Se). However, now the factor becomes negative, and the resulting surface morphology becomes a scaled-down inversion of the original surface morphology (FIGS. 2G, 2H). Operation in Region III, defined by Se>2, leads to both an inversion and amplification of the original surface morphology by the factor (1−Se), which is now less than −1 (FIGS. 2I, 2H). Thus we find that operation in Regions I and II leads to the generation of a surface that has a higher degree of planarity than that of the starting surface, while operation in region III amplifies the roughness present in the initial film.

The efficiency of the overall process hinges on how closely one can match the etch rates of the GaN and the chosen sacrificial material. If one employs this method with etch conditions that do not meet the "selectivity=1" criteria, an iterative approach to surface planarization can be taken to reduce surface roughness to an acceptable range. With each iteration of the process, the surface roughness is reduced to a fraction of the initial roughness. The following formula gives the final roughness ($R_f$) as a function of the initial roughness ($R_i$), etch selectivity (Se) and the number of process iterations (n).

$$R_f = R_i (|1-Se|)^n$$

It can be seen that the final roughness decreases exponentially with the number of iterations (provided 0<Se<2). The end result is an asymptotic approach to a surface of atomic scale roughness. The speed at which this occurs is dependent on how close the selectivity is to one.

The appropriate period of etching depends on the etch rates of the sacrificial material and the III-nitride material. Calibration experiments can be performed on separate samples of the planarization material and the III-nitride material in order to predict the appropriate time required to etch a layer of a given thickness. Optionally, the progress of etching can be monitored using mass spectrometry, e.g., of samples taken from a plasma after different periods of etching. This will reveal the period of etching that results in complete etching of the sacrificial material and leads to etching of pure III-nitride material, which is one possible endpoint for the etch procedure.

Figure 3:
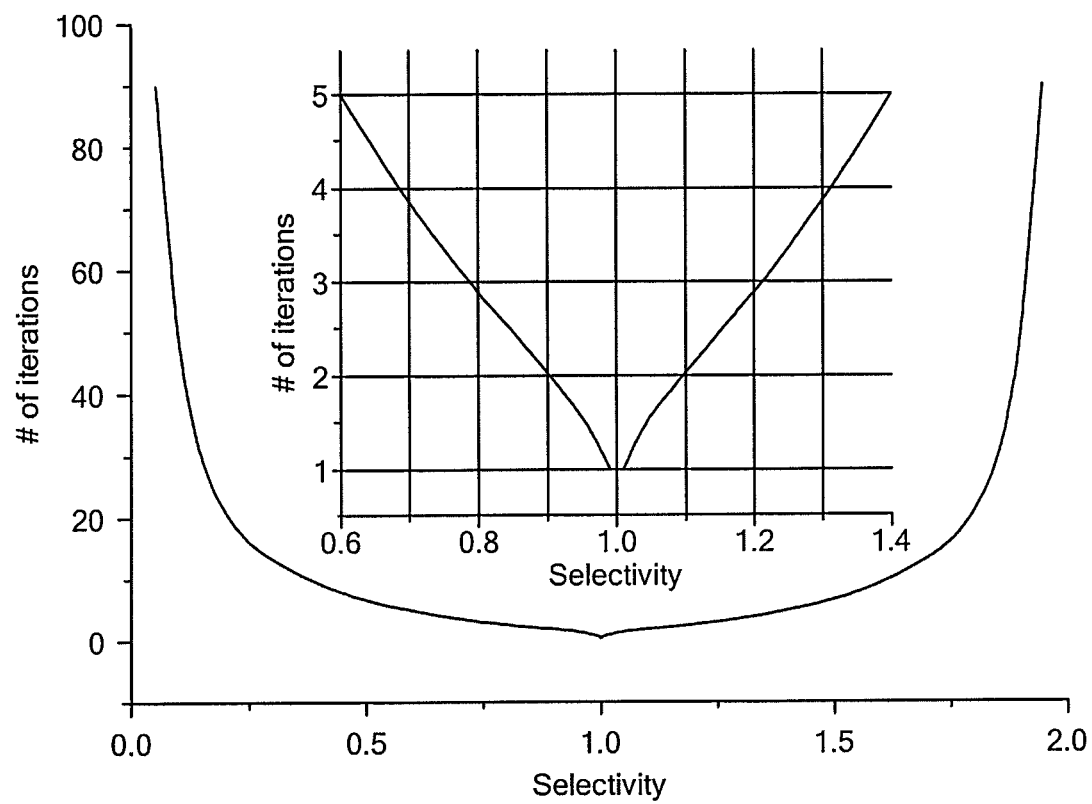
FIG. 3 shows the number of etch-back iterations required to achieve 99% reduction in surface roughness as a function of selectivity of etching.

FIG. 3 shows the number of iterations required to obtain a roughness reduction of 99% from the initial roughness as a function of the selectivity of etching. The number of iterations necessary to achieve a 99% roughness reduction becomes prohibitively high as the selectivity deviates significantly from one. For selectivity values of 0.9, 0.8, and 0.7, the number of iterations required for 99% roughness reduction is 2, 3 and 4 respectively. Thus, a cost effective process should operate at a selectivity close to one, e.g. in the range of 0.8 to 1.2.

The etch rates for the various crystal planes of GaN are nearly identical utilizing dry etch techniques; therefore, a dry etch-back process can planarize the various crystal orientations equally efficiently, including the rather difficult Ga-polar surface, which tends to be the preferred surface for the growth of devices. Another advantage of etched-back surfaces versus CMP surfaces is that there are no scratches with the etch-back process. The use of grits and abrasive pads in CMP generally leaves the surface with a network of scratches, i.e., linear surface defects deviating from the final surface plane by 1 µm or more, requiring further surface preparation prior to epitaxial growth of subsequent layers. An additional advantage of etching compared to CMP is the ability to planarize material with curvature. Thick GaN films grown on non-native substrates inevitably have some degree of curvature due to the stress fields induced from the mismatching of lattice constants and thermal expansion coefficients. Mechanical polishing techniques require samples to be flat for the even application of force (which leads to polishing action) across the surface. The etch-back technique bypasses this constraint, as the etch rate is uniform across a sample and independent of the surface's spatial coordinates. Lastly, the etch-back technique is a very controlled approach to planarization, since etch rates for dry processes are tunable and quite reproducible. This allows etch-back application to thin films (~1 µm or greater). Chemo-mechanical polishing typically sacrifices a significant of material, making it unsuitable for thin films.

The etching of GaN with substantial rates is a significant problem due to its strong bond strength of 8.92 eV/atom along with its unusual chemical inertness. However, GaN can be etched with dry etching techniques using high-density plasmas generated by inductively coupled and electron cyclotron sources. Such processes offer independent control of the ion density in the plasma as well as control of the impact energy of plasma particles onto the sample. These methods typically produce etch rates on the order of tenths of microns per minute utilizing chlorine-based plasma chemistries. In the planarization methods according to the present invention, inductively coupled plasma reactive ion etching (ICP-RIE) of GaN and photoresist is a preferred etching method.

The etch rate of a material by ICP-RIE is dependent on a number of factors that can each be classified as contributing to either the chemical or physical component of the etch, or sometimes both. The bias applied to the sample stage is the primary means of controlling the energy with which plasma particles strike the sample. The impact of ionized particles leads to the breaking of atomic bonds and is a physical sputtering process. The choice of plasma chemistry on the other hand involves the selection of gases that react favorably with the constituent atoms of the sample to generate volatile byproducts that can be quickly removed from the sample surface. The selection of etchant gases therefore greatly influences the efficiency of the chemical component of the etch. The addition of heavier non-reactive species such as argon may also shift the relative weights of the chemical and physical components of the etch towards physical processes. Another factor that influences the etch rate is the number and type of available ionized species in the plasma. This can be controlled by adjusting the amount of RF power coupled into the plasma as well as by appropriately adjusting the chamber pressure to maximize the generation of molecular ions.

Of the various independent controls available, stage bias was studied as a means to minimize selectivity between GaN and AZ5214e photoresist. For ICP etch processes, it is understood that the reduction of selectivity between two materials is a function of stage bias. As stage bias is increased, the etch mechanism shifts towards physical sputtering, which is less selective than chemical etching mechanisms. The effect is undesirable for most device processing applications where the goal is to both rapidly and selectively etch a specific material and not the etch mask, or to stop on a specific device layer by using a selectivity-based etch-stop layer. This effect, however, is quite advantageous for the etch-back planarization process of the present invention, since the goal is etch-rate matching of GaN and the photoresist sacrificial layer.

The ion bombardment that occurs during etching by ICP-RIE causes damage to the etched surface. Such damage would be undesirable in the case of further epitaxial growth of III-nitride materials. A variety of types of damage occur during dry etching of GaN. A major detrimental result of high-energy ion bombard is the displacement of surface atoms from their original lattice sites. Such displacements effectively destroy crystal symmetries a few monolayers deep and are likely to have an adverse affect on subsequently grown epitaxial layers. Associated damage includes the shallow implantation of plasma species as well as the loss of nitrogen from surface group V lattice sites. Another critical damage from the etching process is the bonding of plasma ions to surface atoms of the etched sample to form non-volatile byproducts. Such byproducts are continuously removed during the etching process by physical sputtering, but contamination remains upon process completion.

Surface damage can be quantified by comparative measurements such as luminescence (photoluminescence or cathodoluminescence), X-ray photoelectron spectroscopy, and contact resistivity of an etched surface compared to a control sample.

Fundamentally, there are two approaches to addressing etch damage in semiconductors. The first is to promote healing of the material through annealing-induced recrystallization processes. This method has been found to be insufficient for GaN. The other approach is to develop a method for the removal of the damaged layer to reveal the underlying undamaged material. For GaN, this can be achieved by etching in strong acids or bases at elevated temperatures (>80° C.).

Thermal annealing in an ambient of GaCl, HCl, $H_2$, and $N_2$ was found to be a useful scheme to remove a few monolayers of GaN to expose the undamaged material beneath the damaged surface. Decomposition of GaN readily occurs at lower temperatures in the presence of hydrogen, which acts to remove damaged layers. However, lower temperature annealing results in post-annealing surface roughness due to the fact that uniform etching of GaN in hydrogen ambient is hindered by the surface accumulation of gallium. On the other hand, the use of higher temperatures bypasses this problem, as HCl readily reacts with gallium at temperatures above 600° C. to produce GaCl, which is volatile, thereby promoting even decomposition.

The examples herein are provided to illustrate advantages of the present invention. The examples can include or incorporate any of the variations or embodiments of the invention described above. The embodiments described above may also each include or incorporate the variations of any or all other embodiments of the invention. The following examples are not intended in any way to limit the scope of the invention.

Example I

Application of a Planarization Layer by Spin Coating

Figure 4:
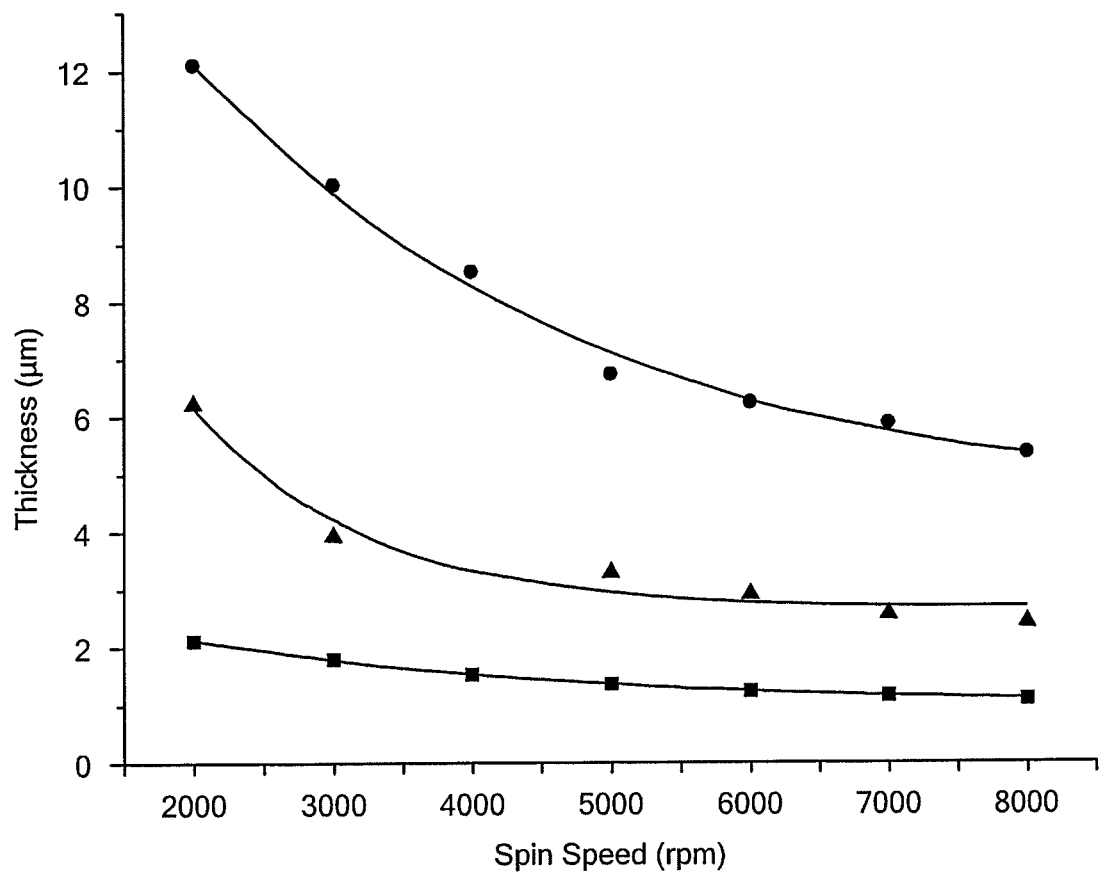
FIG. 4 shows the thickness of the resulting layer of sacrificial planarization material deposited by spin coating as a function of spin speed for three different photoresist materials; squares refer to AZP5214E; circles refer to AZP4620; triangles refer to AZP4330RS; lines are exponential fits.

The deposition of sacrificial material onto a rough GaN surface for etch-back is ideally intended to fill up valleys and produce its own planar surface. To this end, the deposition of photoresist by spin coating was studied. Three photoresists of varying viscosities, listed in Table 1, were characterized for their ability to form a planar coating on surfaces of varying roughness under multiple spin conditions. A general calibration curve of thickness versus spin speed is presented in FIG. 4. In each case, the surface was saturated with the respective photoresist, and the sample was spun for 45 s at the indicated speed.

TABLE 1

| Photoresist | Dynamic Viscosity |
|---|---|
| AZ5214e | 24 mPas |
| AZ4330RS | 114 mPas |
| AZ4620 | 520 mPas |

Example II

Figure 5A:
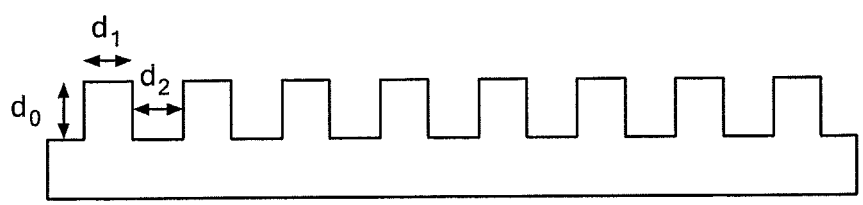
FIG. 5A shows a structure used to simulate different degrees of roughness.

Optimization of Spin Coating Conditions and Photoresist for Surface Feature Amplitude Reduction In order to simulate the various degrees of roughness may be encountered in using the etch-back process, silicon test structures were fabricated. Silicon (100) wafers were patterned by standard photolithographic techniques and etched by reactive ion etching (RIE) in SF6 to form a network of trenches. FIG. 5 illustrates the two structures studied. These structures acted to simulate surface protrusions of different heights and aspect ratios. Etch depths of 0.2, 1.3, and 2.2 µm were chosen because they represent the approximate range of roughness encountered when applying the etch-back technique as a finishing process. A sample with higher roughness would first need to be lapped until the roughness falls within this range.

Figure 6:
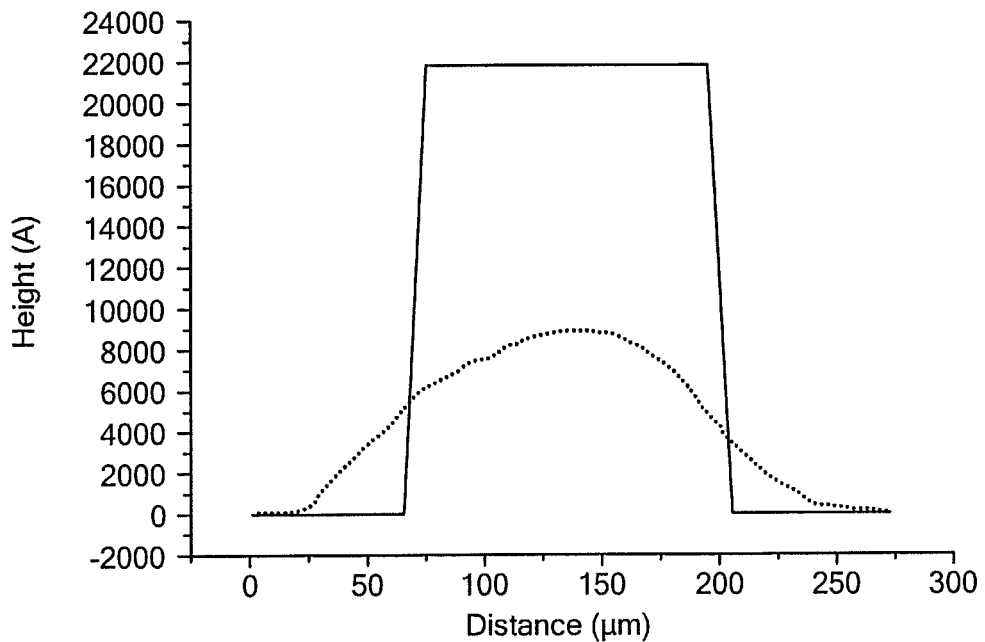
FIG. 6 shows the profile of a AZ4620 photoresist coating (dashed line) applied onto a step feature (solid line)

Each of the three photoresists listed in Table 1 was spin coated onto these structures at various spin speeds for 45 s. The resulting photoresist profiles were then measured by an Alpha-Step profiler. The degree to which each photoresist replicated the initial surface features was ascertained by measuring the amplitude of the photoresist features. FIG. 6 shows an AZ4620 profile after spinning for 45 s at 2000 rpm. The height of the photoresist features (0.9 µm) for this condition was 59% less than the height of the initial surface features (2.2 µm). Thus, the photoresist surface has a higher degree of planarity than the initial surface as well as a marked reduction in gradient at transition edges.

Figure 7A:
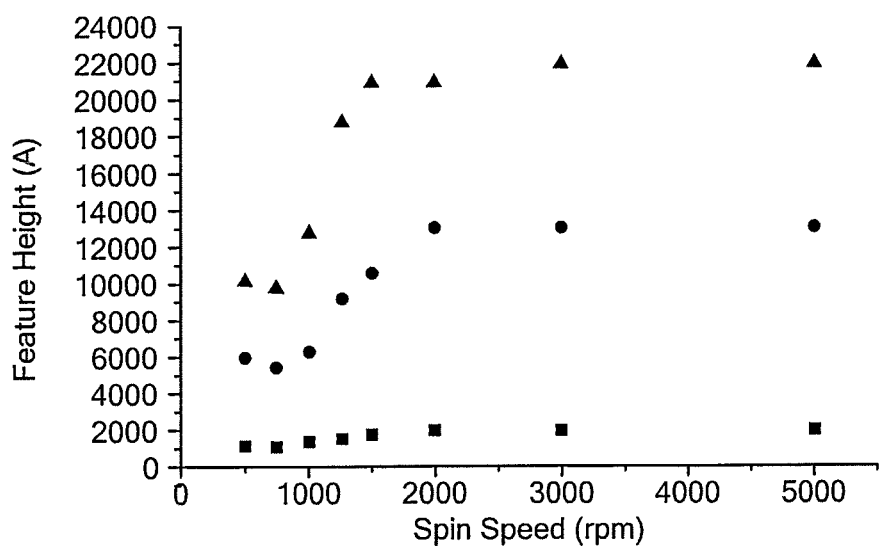
FIG. 7A shows the results for 0.2 µm (squares), 1.3 µm (circles), and 2.2 µm (triangles) using AZ5214e photoresist.
Figure 7B:
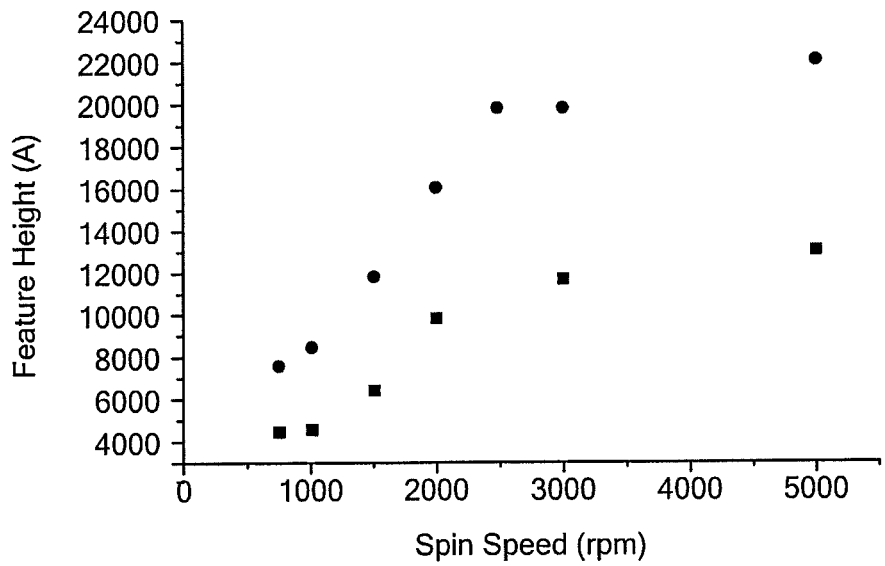
FIG. 7B shows results for 1.3 µm (squares) and 2.2 (circles) using AZ4330-RS.
Figure 7C:
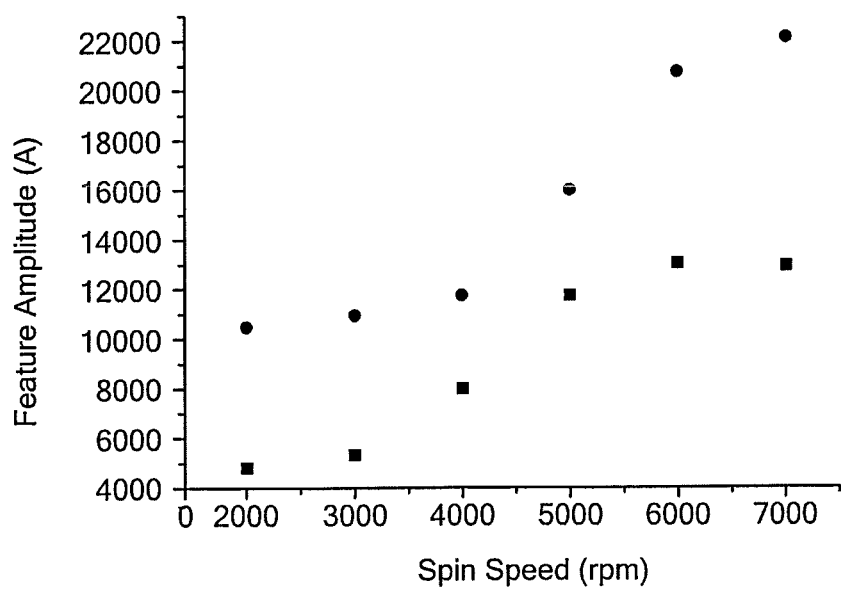
FIG. 7C shows results for 1.3 µm (squares) and 2.2 (circles) using AZ4620.

FIG. 7 shows the feature amplitude measurements for each photoresist applied to structures of different amplitude. In each case, higher spin speeds led to conformal coatings in which there was no reduction in feature height from the initial surface to the photoresist surface. As spin speed was reduced, the photoresist dampened the feature amplitude of the underlying surface. For example, in FIG. 7C, the data shown as circles represent the height of AZ4620 photoresist features after deposition at various spin speeds onto a square wave structure with an amplitude of 2.2 µm. The closed squares represent the same conditions except the square wave structure had an amplitude of 1.3 µm.

The explanation of the results is as follows. Photoresist makes a transition from behaving like a Newtonian fluid to a non-Newtonian fluid with the evaporation of its solvents. This transition occurs more rapidly at higher spin speeds since the coating becomes thinner and there is less solvent to evaporate. Once the transition is complete, the photoresist is stable and its form will not change under the forces of spinning, gravity, etc. Secondly, the shape a fluid's free surface under acceleration is different from that of the rest state. During the spin, the photoresist is under constant centripetal acceleration. At high spin speeds, photoresist will complete its Newtonian to non-Newtonian fluid transition, locking its free surface into an agitated state. At lower spin speeds, however, the photoresist does not complete its transition and remains in a liquid state of higher viscosity. In this state the photoresist is able to relax and can flow more readily into the etched crevices. There is a narrow range of spin speeds where the photoresist is viscous enough to be stable on the wafer, but fluid enough to seep into valleys on the surface. This regime is represented by the two leftmost points of each of the curves of FIG. 7, just before the photoresist feature amplitude begins to rise. As spin speeds are lowered from this metastable operating range, the quality of the coatings diminishes significantly. Table 2 lists the optimal spin conditions for each photoresist along with the percent reduction of the photoresist features relative to the initial surface features. While AZ4330RS appears to outperform the other photoresists in its planarity, there is no significant advantage in using it over AZ5214e, which achieves reasonable results with the deposition of significantly less material. This becomes important during the etching step when the time required to etch back the photoresist at typical etch rates of 100 nm/min is considered.

TABLE 2

| Photoresist | Optimal Deposition Condition | Thickness Deposited | Percent Feature Reduction |
|---|---|---|---|
| AZ5214e | 750 RPM, 45 s | 3.5 µm | 60% |
| AZ4330RS | 750 RPM, 45 s | 12.1 µm | 67% |
| AZ4620 | 3000 RPM 45 s | 10.0 µm | 55% |

Example III

Effect of Surface Feature Aspect Ratio on Photoresist Feature Height

Figure 5B:
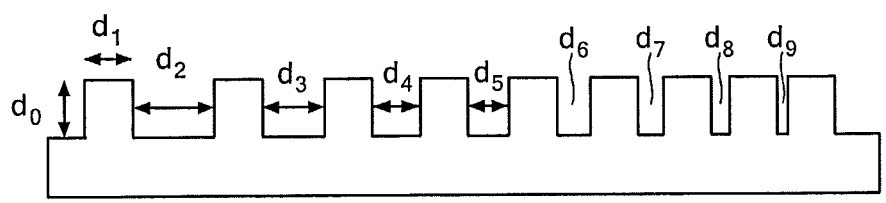
FIG. 5B shows a structure used to simulate different aspect ratios of surface roughness features.
Figure 8:
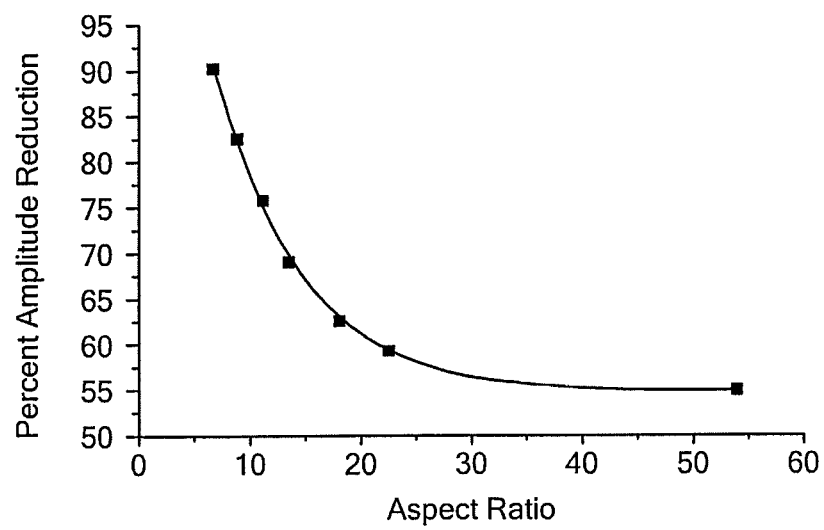
FIG. 8 shows the aspect ratio dependency of surface feature amplitude reduction using AZ5214e.

The effects of aspect ratio on the photoresist profile were studied using the set of silicon test structure shown in FIG. 5B. The results are presented in FIG. 8. The results showed that features with low aspect ratio were easier to planarize than features with high aspect ratios.

The first set of test structures had aspect ratios of 600, 92.3, and 54.5, for etch depths of 0.2, 1.3, and 2.2 µm respectively. For the etch-back process, these values represent very challenging scenarios since they fall to the extreme right in the curve of FIG. 8. The aspect ratio of features on a real GaN surface is likely to be much smaller, leading to the deposition of a much more planar photoresist layer than on the test structures.

Figure 9:
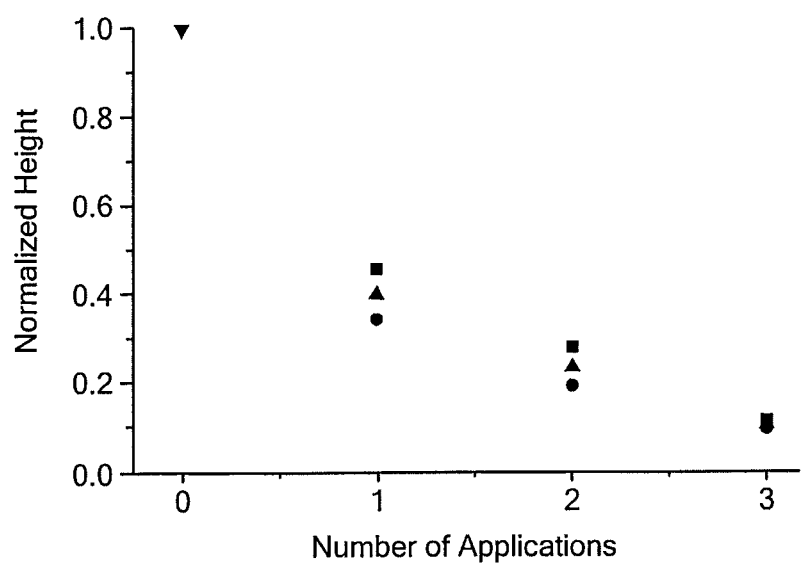
FIG. 9 shows the normalized surface feature height as a function of the number of depositions of different photoresists; initial feature height (inverted triangle), AZ4620 (squares), AZ4330RS (circles), and AZ5214e (triangles)

Multiple depositions were also performed, and the results are shown in FIG. 9. Photoresist was deposited successively with the expectation each subsequent deposition would lead to a further reduction in surface height amplitude. A substantial reduction in amplitude (~90%) was achieved after three depositions on high aspect ratio features.

Thus, the nature of certain surface features make them easier to planarize than others. For example, two undesirable features commonly found on GaN templates are hexagonal pits (low aspect ratio) and truncated hexagonal pyramids (high aspect ratio). Features that are more difficult to planarize require a greater number of iterations of the spin coating process to achieve an essentially planar surface of the planarization layer.

Example IV

Inductively Coupled Plasma Reactive Ion Etching of GaN

The selectivity between GaN and AZ5214e photoresist was quantified as a function of stage bias. AZ5214e photoresist was spin coated at 4000 rpm for 45 s onto six HVPE-grown GaN samples, all from the same wafer. The samples were exposed and developed to yield a photoresist pattern of 300 μm×300 μm squares with a thickness of approximately 1.5 μm as measured by an Alpha-Step 500 surface profiler. In order to make accurate measurements, profiles of each sample were measured at 10 random locations. The samples were then etched in pure chlorine plasma at a chamber pressure of 3.8 mtorr, with an RF plasma power of 350 W and at stage bias values ranging from −100V to −600V in 100V increments. The photoresist as well as GaN in the open photoresist windows were etched simultaneously for each condition and the resulting height profile measured. Finally, the photoresist was removed from the samples by sonication in acetone, and the GaN etch depth was measured. FIG. 10 illustrates this series of measurements. Etch rates were determined for each material as follows.

$$\text{Photoresist etch rate} = \frac{d_{PR} - (d_{GaN+PR} - d_{GaN})}{t_{etch}}$$

$$\text{GaN etch rate} = d_{GaN} / t_{etch}$$

where
$d_{PR}$=height of photoresist pattern post-development
$d_{PR+GaN}$=height of photoresist and GaN post-etch
$d_{GaN}$=height of GaN features post-etch
$t_{etch}$=etch time.

Figure 12:
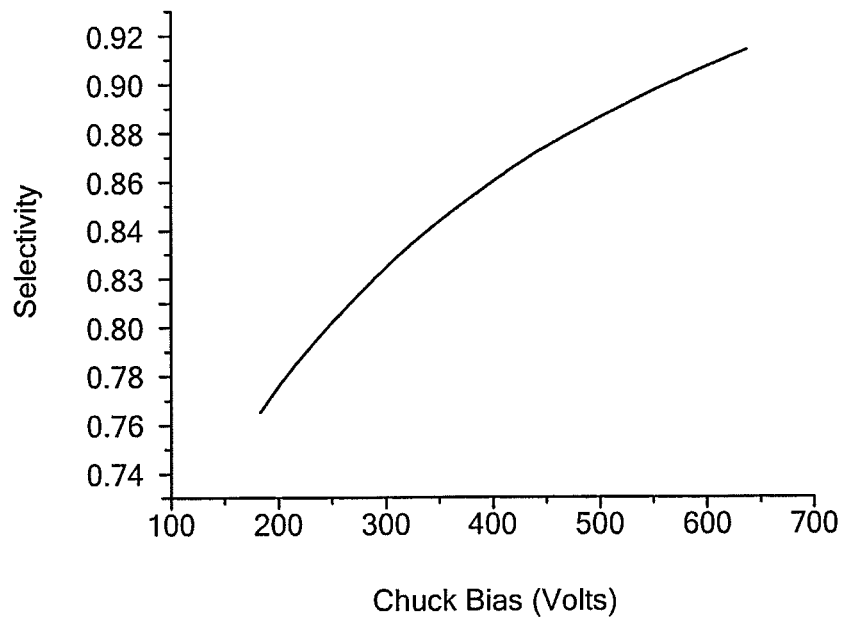
FIG. 12 shows the selectivity (ratio of GaN etch rate to AZ5214 etch rate) as a function of stage bias (chuck bias)

FIG. 11 shows the measured etch rates under the indicated bias conditions. For this range of conditions, the etch rates for both GaN and AZ5214e exhibited a near linear dependence on the applied bias. A linear fit was applied to each set of data, and from these lines a GaN/AZ5214e selectivity curve is presented in FIG. 12. The etching process became more indiscriminant as ion bombardment energies increased, due to the promotion of physical sputtering mechanisms that are inherently less selective. At a stage bias value of −600V, a selectivity of 0.91 was achieved.

Example V

Detection of Surface Damage by Contact Resistivity

Figure 13:
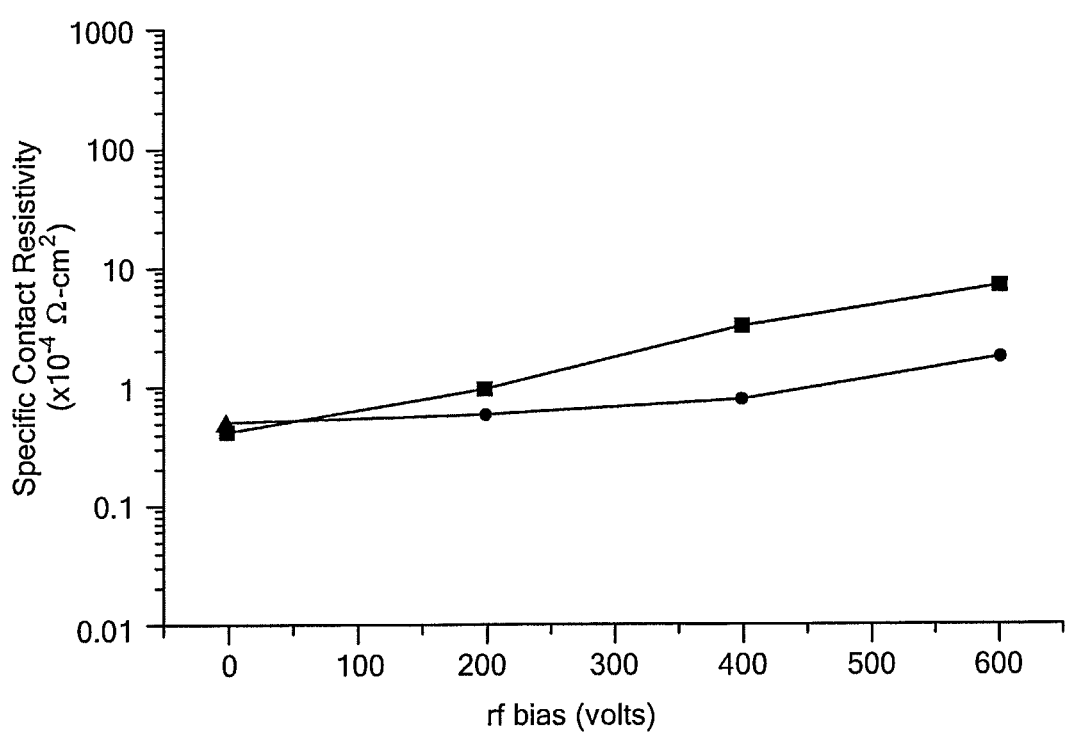
FIG. 13 shows the contact resistance of Ti/Al/Au contacts to etched GaN with (circles) or without (squares) annealing by HCl dip.

Six n-type GaN samples grown by MOVPE, with a carrier concentration of $10^{18}$, were etched using the same conditions as described in the previous example with etch biases of −200V, −400V, and −600V (two for each bias condition). For one set of samples, ohmic contacts were deposited by electron beam evaporation on the as-etched material in the shape of circular TLMs using Ti, Al, and Au with a thickness of 25, 200, and 1500 angstroms respectively. For the other set, the same contacts were applied after the samples were dipped in 1 M HCl solution for one minute. Contact resistivity was measured and is plotted in FIG. 13.

Contact resistivity increased with etch bias for both sets of samples, indicating the injurious effect of higher energy ion bombardment on the GaN surface. The samples that were etched in HCl prior to contact deposition exhibited some degree of recovery, potentially owing to the etching away of contaminants from the etch procedure, including post-etch oxides formed on the nitrogen depleted surface.

Example VI

Detection of Surface Damage by Cathodoluminescence

N-type HVPE-grown GaN samples (all from the same wafer) were subjected to etching under the conditions described in Example IV with bias values of −100V, −400V, and −600V. Wet etching in HCl and rapid thermal annealing were investigated as methods of damage remediation. Cathodoluminescence of the samples was studied using a 2 kV electron beam in a JEOL JSM-6100 SEM system to excite luminescence at the surface. Higher energy beams penetrate to the undamaged bulk below the surface, resulting in uninformative data. Because exposure of the sample to the electron beam induced time-dependent changes in the material, time dependent scans of the luminescence at the peak wavelength (363 nm) were measured, and only the values at t=0 were used for comparison.

Cathodoluminescence measurements of an as-grown GaN sample were compared to similar measurements of a set of etched GaN samples that were subsequently dipped in HCl. The luminescence measured at time=0 was indicative of the relative luminescence of the samples. The luminescence of the sample etched at −600V (1 min HCl dip) was 2.6 times lower than that of the sample etched at −100V (1 min HCl dip), which in turn was 9.3 times lower than the as-grown sample. This is further evidence that higher etch biases caused more surface damage. The luminescence of the samples that were dipped in HCl for 20 minutes showed modest improvement, but still were far below that of the as-grown sample.

Example VII

High Temperature Annealing with $N_2$

Rapid thermal annealing was also examined as a means of healing etch-induced damage by means of surface recrystallization. The samples for this study were etched at a bias of −100V, which represents a lower damage level when compared to an etch performed at −600V. The samples were annealed in an ambient of nitrogen for one minute at temperatures ranging from 600-1100° C. in a rapid thermal annealing oven. A GaN proximity cap was used to suppress decomposition of each sample surface during the annealing process. Cathodoluminescence measurements were then taken.

The luminescence for samples annealed at temperatures ranging from 600° C. to 900° C. showed very little improvement, while samples annealed at 1000° C. and 1100° C. exhibit increases in luminescence by a factor of 1.6 and 3.5 respectively.

Example VIII

High Temperature Annealing with GaCl, HCl, $N_2$, and $H_2$

A sample etched at a bias of −100V was subjected to thermal annealing for 10 minutes at 750° C. in an ambient of GaCl, HCl, $N_2$, and $H_2$ in an HVPE growth chamber operating at atmospheric pressure. GaCl and $H_2$ were generated in a quartz tube via the reaction of HCl with liquid gallium. Based on the measured conversion efficiency of this process for the specific reactor geometry used, an initial flow of 14 sccm of HCl was converted to a flow of 5.6, 8.4, and 4.2 sccm of HCl, GaCl, and $H_2$ respectively. 2500 sccm of nitrogen acted as the carrier gas. The temperature of 750° C. was chosen because the natural thermal decomposition of GaN occurs at a negligible rate at this temperature in an ambient of nitrogen at atmospheric pressure. Therefore, decomposition was simply controlled by the on-off state of the mass flow controller for HCl. The surface morphology (not shown) was unchanged after annealing, and the roughness was the same to within the accuracy of the measurement. Comparative cathodoluminescence of the as-grown and etched/annealed sample (not shown) revealed a complete recovery of the luminescence, suggesting this process was successful in stripping the damaged GaN layer.

Example IX

Reduction of Surface Roughness Features in GaN by Etch-Back Method

Five microns of GaN was deposited onto both (0001) and (10-12) sapphire substrates by the HVPE method. The GaN deposited on (0001) sapphire was of [0001] orientation (C-plane), while the film deposited on the (10-12) sapphire had [11-20] orientation (A-Plane). The two films were evaluated by AFM to have an rms roughness of 133 nm (C-plane sample) and 414 nm (A-plane sample) over an area of 50 μm×50 μm. Additionally, the polarity of the C-plane sample was confirmed to be gallium-polar utilizing a standard polarity-determining KOH etch on a sample from the same wafer. AFM and SEM images of the initial surface morphology are shown in FIGS. 14-16.

A sacrificial layer of AZ5214e was spin coated onto the GaN surfaces at a speed of 800 RPM leading to a deposition thickness of 3.2 μm with a smooth, reflective surface. The sample was then subjected to ICP etching for 35 minutes in chlorine plasma. This was performed at a chamber pressure of 3.8 mtorr, RF plasma power of 350 W, and a stage bias of −400V, leading to an etch rate of 107 nm/min and a selectivity of 0.85. In this experiment the sample was slightly over-etched to ensure complete removal of the sacrificial layer. In addition, to lessen the surface damage induced by the ICP process, the stage bias was reduced to −100V for the last 10 seconds of the etch, corresponding to the removal of 25 nm of GaN, which is sufficiently deep to remove GaN material damaged at −400V and leave the surface with the effective damage of an etch at −100V. The samples were then ultrasonically cleaned in acetone, methanol, and DI water to remove edge bead photoresist. The surfaces were again characterized by AFM to determine the roughness and the entire process repeated for the number of iterations as indicated in the figure legends to achieve planarization.

Figure 14A:
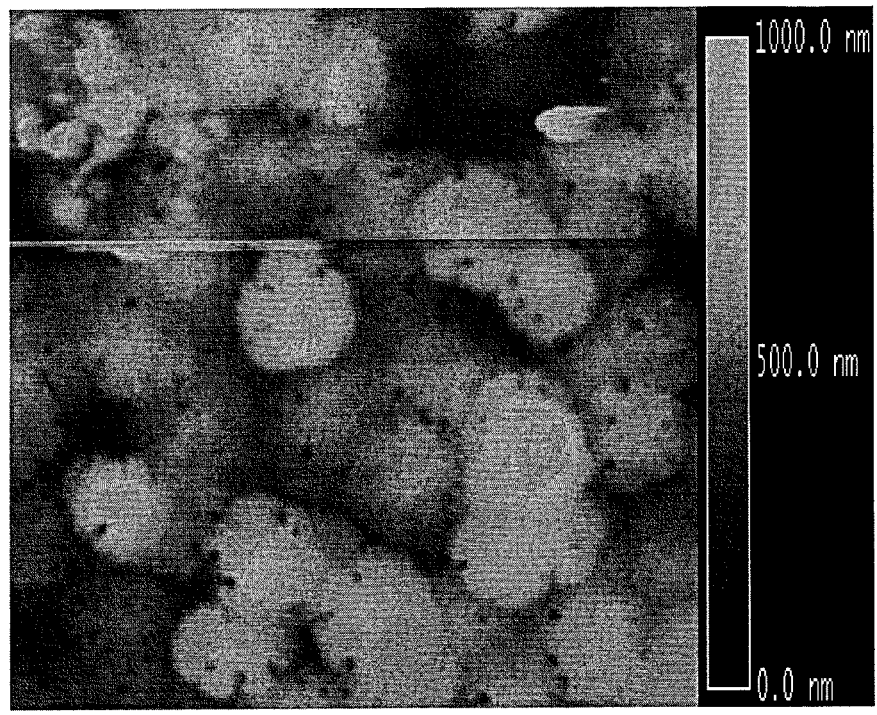
FIG. 14A shows the as grown surface (rms roughness=133.8 nm)
Figure 14B:
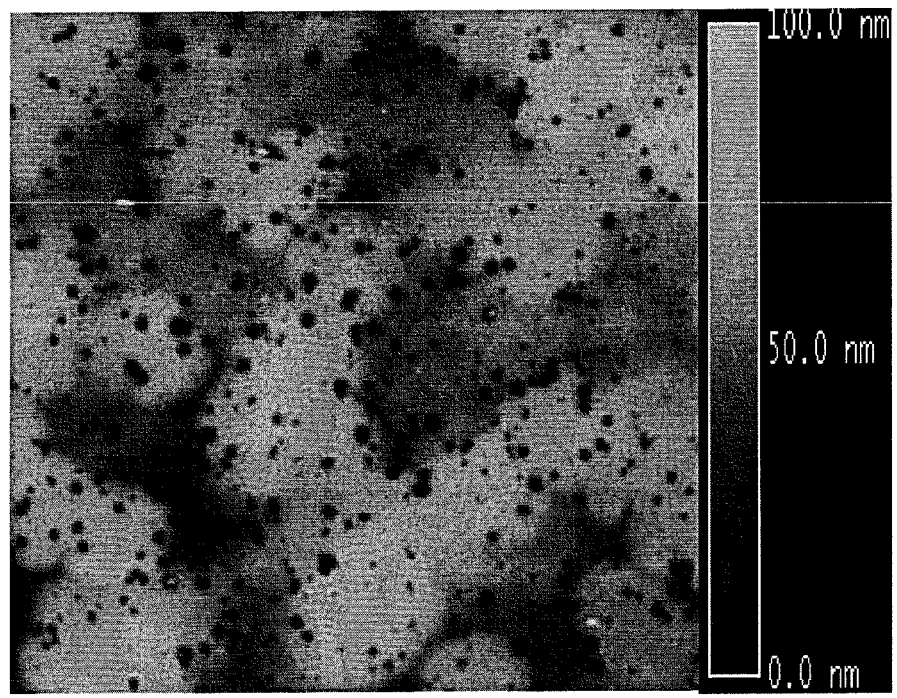
FIG. 14B shows the same surface after one iteration of etch-back (rms roughness=15.6 nm)
Figure 14C:
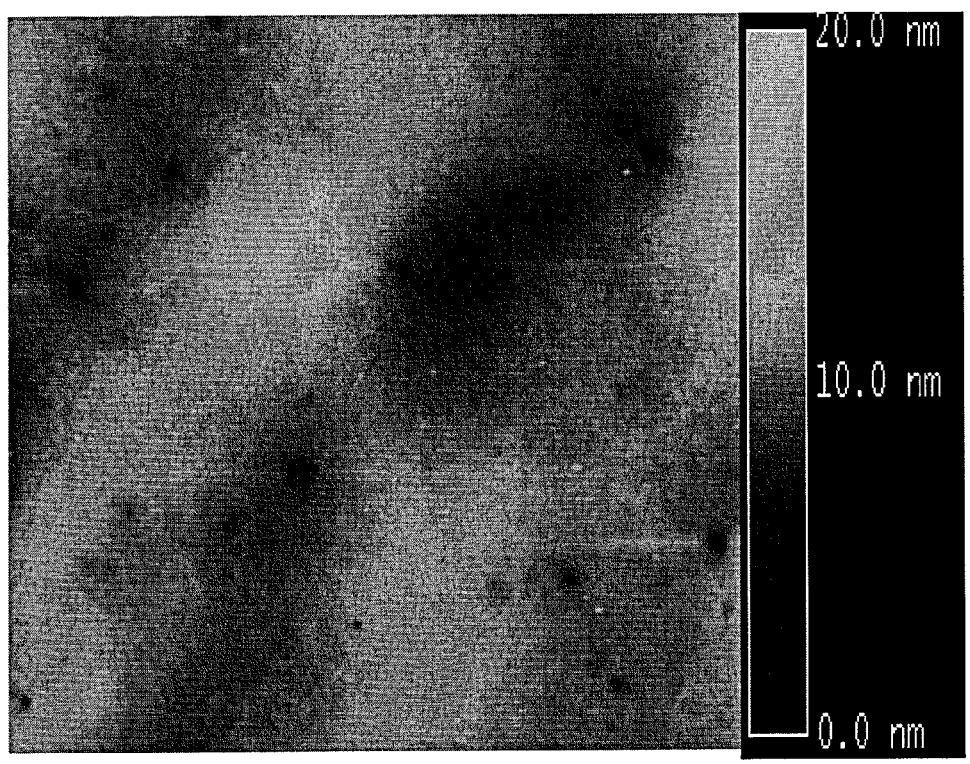
FIG. 14c shows the same surface after two iterations of the etch-back process (rms roughness=2.1 nm)
Figure 15A:
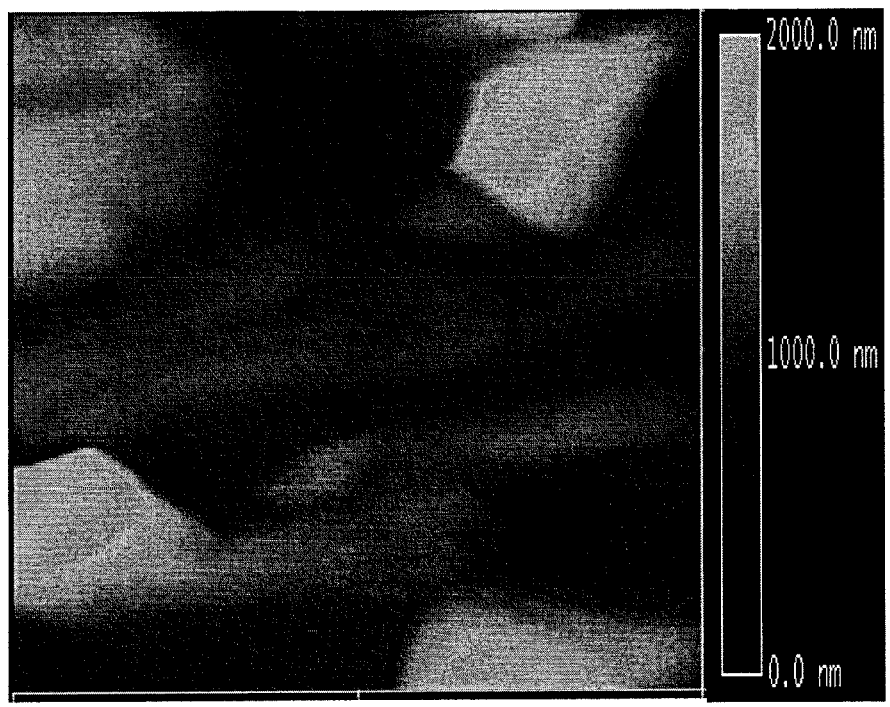
FIG. 15A, as grown (rms roughness 414.1 nm)
Figure 15B:
FIG. 15B, after one iteration (rms roughness 90.9 nm)
Figure 15C:
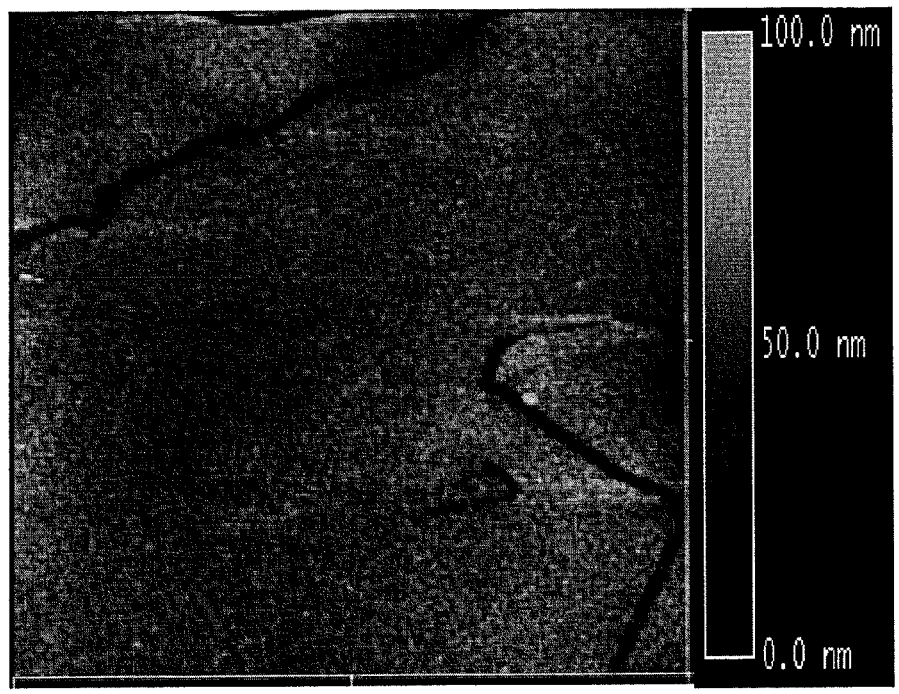
FIG. 15C, after two iterations (rms roughness 12.8 nm)
Figure 15D:
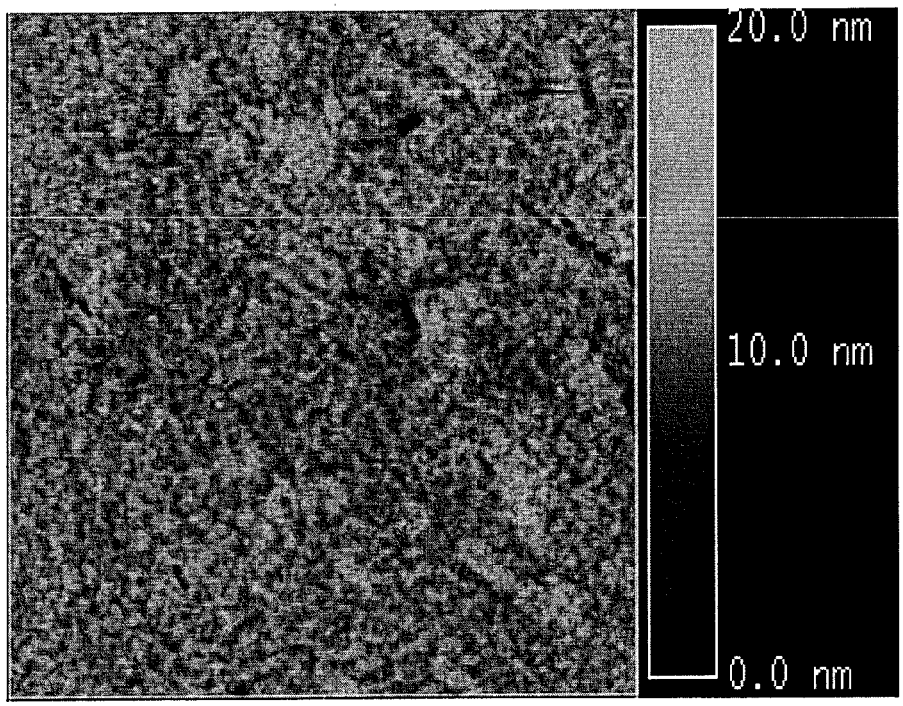
FIG. 15D, after three iterations (rms roughness 4.1 nm)
Figure 16A:
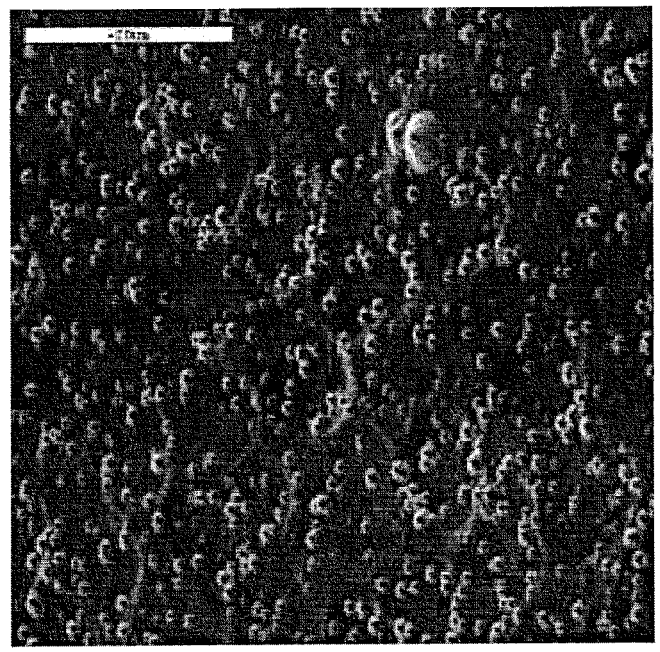
FIG. 16A, as grown, C-plane.
Figure 16B:
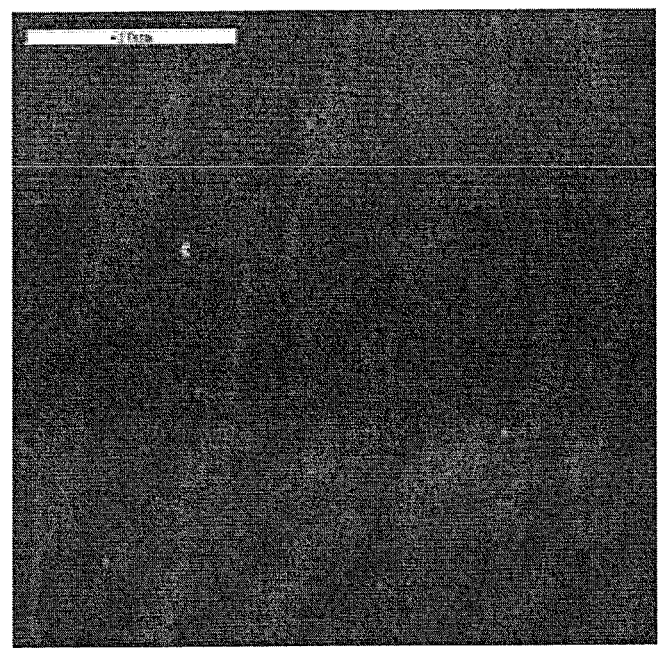
FIG. 16B, post planarization, C-plane.
Figure 16C:
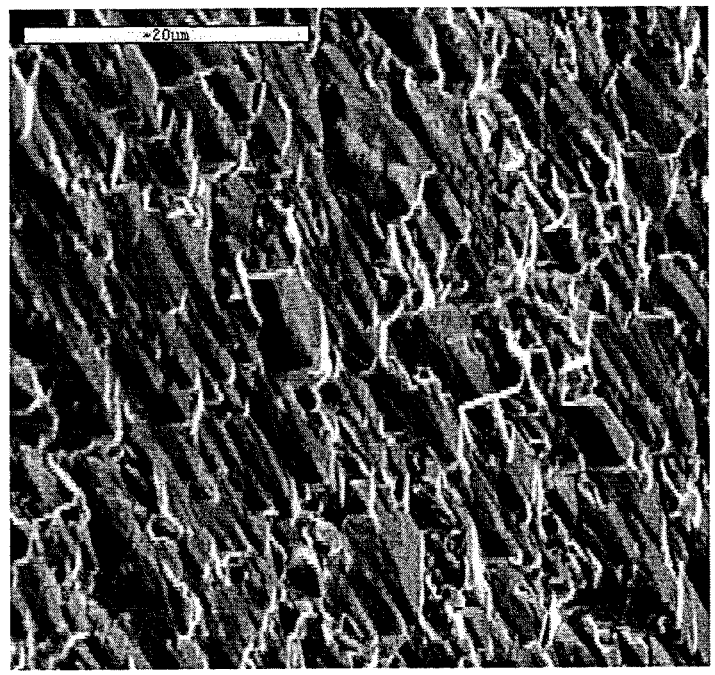
FIG. 16C, as grown, A-plane.
Figure 16D:
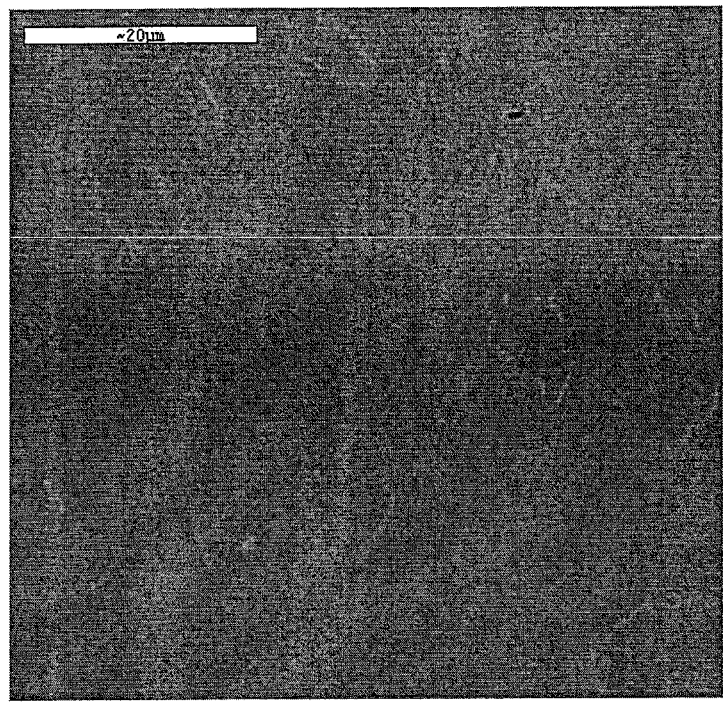
FIG. 16D, post planarization, A-plane.

The comprehensive results of applying the etch-back process on the rough C-plane and A-plane GaN surfaces are shown in FIGS. 14-16. Starting with the C-plane data of FIG. 14, a sequential reduction of 88.2% and 86.4% in the surface rms roughness from the initial state was observed after the first and second iterations of etch-back planarization, respectively. These results correlate well to the expected roughness reduction of 85% per iteration as predicted by etch selectivity. The morphology of the resulting surface was very smooth with a scattered network of shallow depressions extending approximately 10-20 nm deep. These depressions were scaled down remnants of pits observed in the initial film surface. The films planarized by this method were not featureless. However, the feature amplitudes were decreased to insignificant levels. In this case, a final rms roughness of 2.1 nm was achieved after two iterations of the etch-back procedure.

Similar results were observed for the A-plane sample, as shown in FIG. 15, with roughness reductions of 78.0%, 85.9%, and 68.0% after the 1st, 2nd, and 3rd iterations respectively. The A-plane sample required more iterations to achieve nanometer-scale roughness due to the higher initial roughness. Large area SEM images of the planarized C-plane and A-plane surfaces are shown in FIG. 16.

Example X

Surface Roughness of Annealed of GaN

Figure 17A:
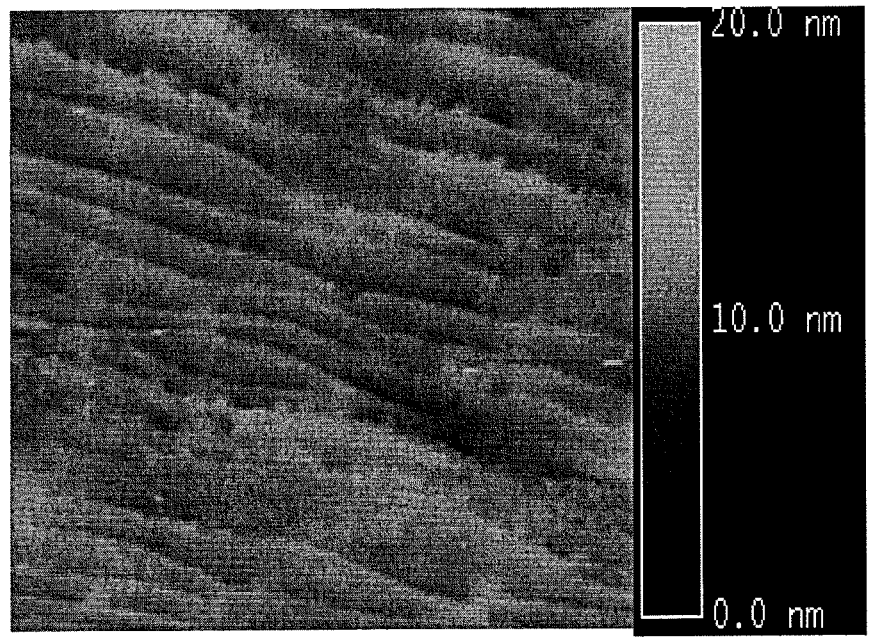
FIG. 17A, AFM image (rms roughness 1.1 nm)
Figure 17B:
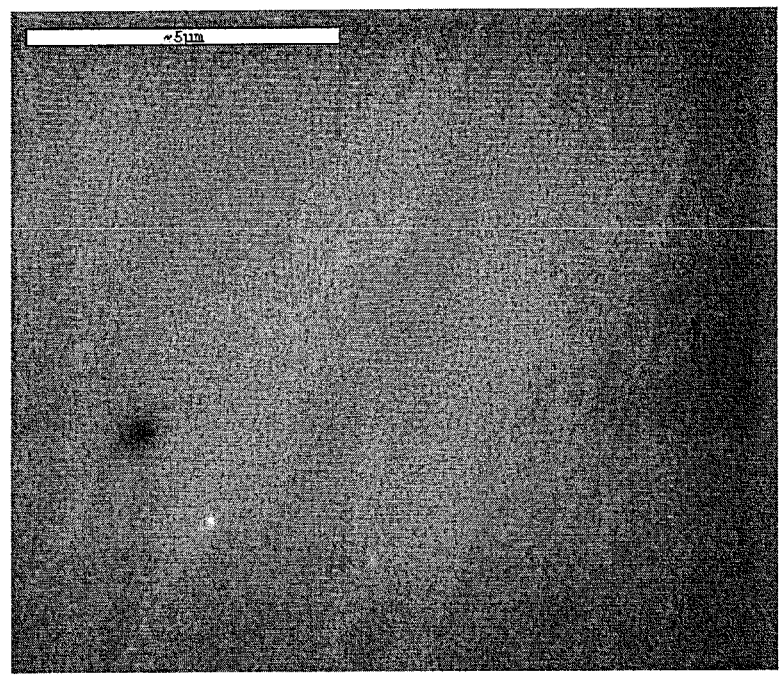
FIG. 17B, SEM image (scale bar represents 5 µm).

The planarized C-plane sample from Example IX was reloaded into the HVPE reactor and was given a pretreatment of $GaCl/HCl/H_2/N_2$ at 750° C. for 10 minutes as described earlier to remove the damage layer. Growth proceeded at a temperature of 1015° C. for one hour. FIG. 17 shows AFM and SEM images of regrown GaN with very smooth surface morphology and evidence of step-flow growth (FIG. 17A). Thus, the high temperature annealing method successfully cured HVPE-grown GaN wafers that were originally deemed too rough for device growth.

While the present invention has been described herein in conjunction with a preferred embodiment, a person of ordinary skill in the art, after reading the foregoing specification, will be able to effect changes, substitutions of equivalents and other alterations to the devices and methods that are set forth herein. Each embodiment described above can also have included or incorporated therewith such variations as disclosed with regard to any or all of the other embodiments. It is therefore intended that protection granted by Letter Patent hereon be limited in breadth only by the definitions that are contained in the appended claims and any equivalents thereof.

What is claimed is:

1. A substrate comprising:
   a first layer, the first layer having roughness features deviating from a surface plane; and
   a sacrificial layer covering the roughness features, the sacrificial layer having an essentially planar surface,
   wherein the first layer responds to a first etching method at a first etch rate,
   the sacrificial layer responds to the first etching method at a second etch rate, and
   the ratio of the second etch rate to the first etch rate is in the range of 0.2 to 1.2.

2. The substrate of claim 1, wherein a mean thickness of the sacrificial layer is less than 2 times a rms roughness of the surface.

3. The substrate of claim 1, wherein the first layer is a layer grown on a crystallographic plane.

4. The substrate of claim 1, wherein the sacrificial layer is a layer which has been applied using spin coating, sputtering, floating, evaporation, melting, stamping, or screen printing.

5. The substrate of claim 1, wherein a mean thickness of the sacrificial layer is at least 100 Å greater than a maximum height of the roughness features.

6. The substrate of claim 1, wherein the sacrificial layer comprises material that is a photoresist selected from AZ5214, AZ4330RS, and AZ4620.

7. The substrate of claim 1, wherein the first etching method comprises inductively coupled plasma reactive ion etching.

8. The substrate of claim 7, wherein the inductively coupled plasma reactive ion etching uses a plasma comprising a gas selected from the group consisting of: $Cl_2$; $BCl_3$; a mixture of $Cl_2$ and $BCl_3$; and a mixture of $Cl_2$ $BCl_3$ and Ar.

9. The substrate of claim 1, wherein the first layer comprises a III-nitride material.

10. The substrate of claim 9, wherein the III-nitride material is GaN and the inductively coupled plasma reactive ion etching uses a plasma comprising $Cl_2$, $BCl_3$, and Ar.

11. The substrate of claim 7, wherein the first layer comprises GaN and the inductively coupled plasma reactive ion etching uses a plasma comprising $Cl_2$, $BCl_3$, and Ar.

* * * * *